(12) United States Patent
Braun

(10) Patent No.: US 6,690,183 B2
(45) Date of Patent: Feb. 10, 2004

(54) RESISTANCE MEASUREMENT

(75) Inventor: Augustin Braun, Karlsdorf-Neuthard (DE)

(73) Assignee: Acam-messelectronic GmbH, Stutensee-Blankenloch (DE)

( * ) Notice: Subject to any disclaimer, the term of this patent is extended or adjusted under 35 U.S.C. 154(b) by 0 days.

(21) Appl. No.: 10/125,766

(22) Filed: Apr. 18, 2002

(65) Prior Publication Data

US 2003/0030451 A1 Feb. 13, 2003

(30) Foreign Application Priority Data

Apr. 19, 2001 (DE) .......................................... 101 19 080

(51) Int. Cl.[7] .............................................. G01R 27/08
(52) U.S. Cl. ........................ 324/711; 324/719; 324/691
(58) Field of Search ................ 327/404, 427, 327/434, 437; 324/658, 691, 711, 719, 721, 722

(56) References Cited

U.S. PATENT DOCUMENTS 5,469,068 A * 11/1995 Katsuma ..................... 324/678
6,410,352 B2 * 6/2002 Damon et al. .................. 438/14

FOREIGN PATENT DOCUMENTS

| DE | 36 42 861 C2 | 6/1988 |
|---|---|---|
| DE | 195 46 304 A1 | 6/1997 |
| DE | 44 20 998 C2 | 3/1999 |
| EP | 0 508 232 A2 | 10/1992 |

* cited by examiner

Primary Examiner—N. Le
Assistant Examiner—Vincent Q. Nguyen
(74) Attorney, Agent, or Firm—McGlew and Tuttle, P.C.

(57) ABSTRACT

In order in a method for measuring the resistance across discharge times of a capacitor to eliminate the interfering influence of the resistance values of electronic switches, the invention provides for a capacitor to be repeatedly charged and discharged and the charging or discharging time is measured by means of at least one resistor (R1, R2, R3) and at least one first switch (S11, S21 or S31) connected in series therewith, at least one second switch (S12, S22 or S32) connected in series with the resistor (R1, R2 or R3) and juxtaposed, parallel-connected switches (S11, S12 or S21, S22 or S31, S32) connected in series with the resistor (R1, R2 or R3). For performing the method, the invention provides a circuit arrangement for resistance measurement having at least one capacitor (C) and at least two resistors (R1, R2, R3) connected in parallel thereto and with the resistors (R1, R2, R3) is in each case associated in series a switch (S11, S21 or S31) and with the first switch (S11, S21 or S31) is connected in parallel at least one second switch (S12, S22 or S32).

17 Claims, 1 Drawing Sheet

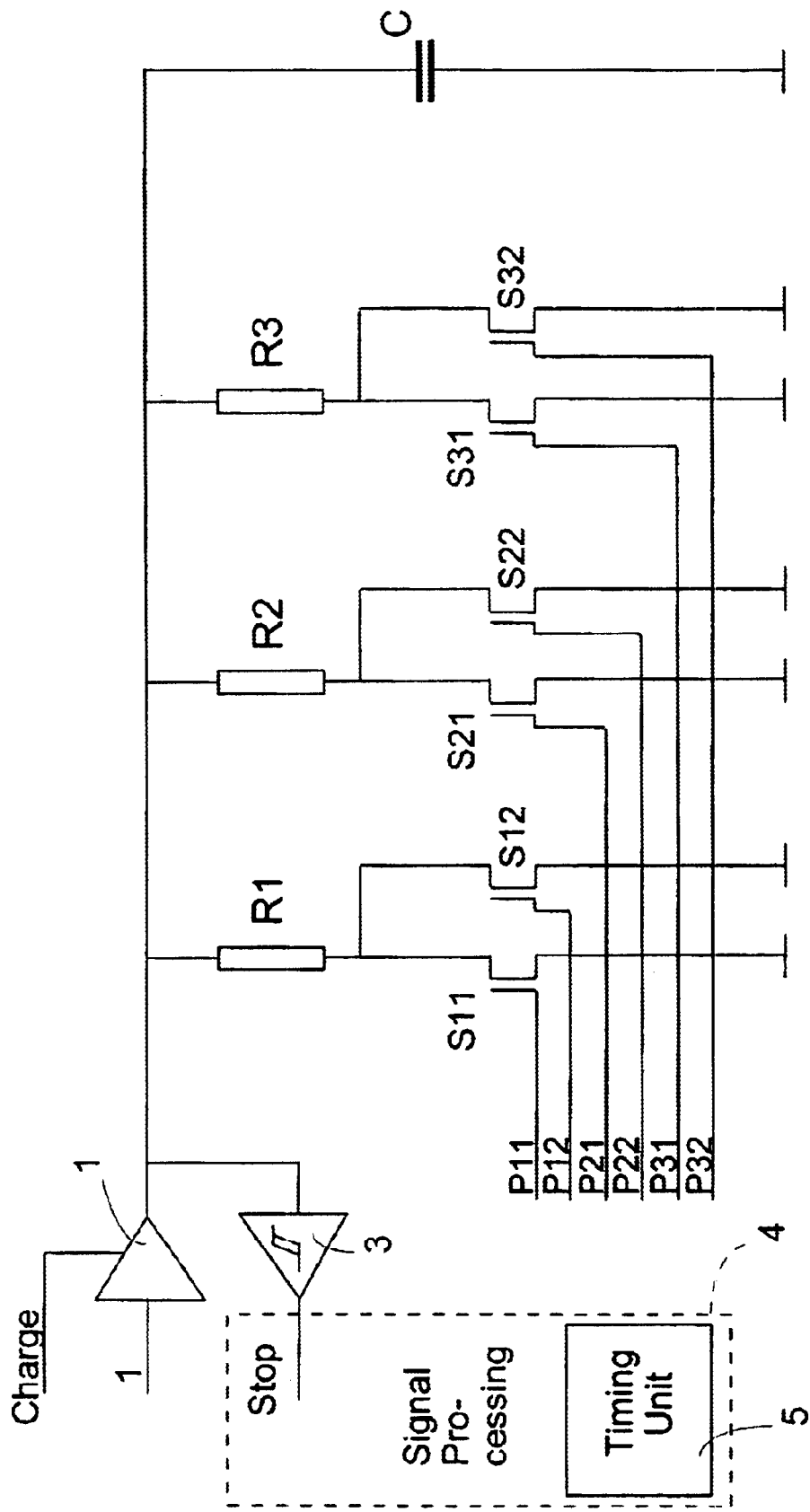

RESISTANCE MEASUREMENT

FIELD OF THE INVENTION

The invention relates to a resistance measurement method and to a circuit arrangement suitable for performing the method.

BACKGROUND OF THE INVENTION

Such methods and circuits can e.g. be used for determining resistance values of strain gauges and therefore for the measurement of strains, e.g. for determining forces, pressures or torques, or also for producing temperature-dependent signals.

Particularly in connection with temperature measurements, it is known to feed a temperature-dependent resistor with a precisely known constant current and to digitize the resulting voltage drop at the resistor by means of a precise analog-digital converter. This requires high quality and therefore very expensive analog components, whose characteristic curve must not shift significantly over a wide temperature range.

It is also known in a first step to set a current of a constant current source with the aid of a reference resistor, to integrate a voltage up to a certain, specific value on a capacitor by means thereof and to measure with a counter the time by which said voltage value is reached and then to store the count. In a second step the constant current is set and inverted with a temperature-dependent measuring resistor and with said current the capacitor is discharged. Once again the time up to the complete discharge of the capacitor is measured and the corresponding count established. The ratio of the two counts is the ratio of the two resistors, which gives the measured temperature. Once again very precise and therefore expensive equipment components are needed, because otherwise the influences of errors would very rapidly become intolerable.

DE 36 42 862 C2 discloses a circuit arrangement for producing a temperature-dependent signal, a reference resistor and a temperature-dependent resistor being provided, by means of which a reference time and a measurement time can be produced and from the comparison of these times can be derived a digital signal associated with the measured temperature. For this purpose a charging capacitor is alternately charged across the reference resistor and the temperature-dependent resistor to the same, predetermined threshold values, the charging times are measured, so that in the case of a known reference resistance from the ratio it is possible to determine the value of the temperature-dependent measurement resistance and therefore a temperature value.

The advantage is this circuit and the corresponding method compared with the known types is that no analog components are required and no special demands are made on the quality of the digital components. However, it is disadvantageous that the measurement takes place during the charging process when a relatively high current must be flowed and in many possible uses this has to be supplied by a battery or a solar module. The internal resistance of the battery or module gives rise to an interfering influence with respect to the resistance determination of the reference and measuring resistor.

Another essential disadvantage is that by means of the determination of the charging time it is not the resistance value of the reference or measuring resistor alone, but instead the resistance value as such is measured, which is given by the indicated resistance and the internal resistance of the electronic switch/transistor connected in series therewith and which is unknown. For as long as the resistance value of the switch, which with CMOS transistors is 10 to 20 ohms with respect to the resistance value of the reference and measuring resistor and with NTC (Negative Temperature Coefficient) resistors is in the range 15 to 20 kohms, is negligible the known method and circuit operate in a satisfactory manner. However, for highly precise temperature measurements it is not possible to use such NTC resistors due to their non-linearity and lack of long-term stability. It is then necessary to use platinum resistors, which have much lower resistance values of approximately 100 to 500 ohms. Thus, as a result of th is with the aforementioned switch resistance values a significant error arises, particularly if it is borne in mind that a platinum resistor in the case of a temperature change of 1° C., changes its resistance value by only 0.4%. The indicated problem can also not be solved by the use of expensive, external power MOSFETs. The latter admittedly have the resistance value of approximately 10 to 15 mohms (milli-ohms), but with a platinum resistor PT100 a temperature change of 0.01° C. leads to a resistance change of 4 mohms and which is therefore of the order of magnitude of the resistance of said MOSFET switch. In addition, such power MOSFETs are not only expensive, but are also unsuitable for measurement electronics for other reasons.

An important disadvantage of strain gauges is the limited shift in the resistance change of such strain gauges. Typically the resistance of a strain gauge varies by approximately 0.2% from 0 to full scale deflection. This value is normally expressed as a change in parts per million (ppm). 0.2% corresponds to the value of 2,000 ppm. Thus, a strain gauge typically has a 2,000 ppm shift. As opposed to this a typical temperature-dependent, platinum resistor (e.g. PT500) changes its resistance per temperature difference degree by 3920 ppm or for a typical temperature shift of 100% by 392000 ppm or 39.2%. Thus, it is not readily possible to transfer to strain gauges methods known from temperature measurements, because the strain gauge shift is approximately 200 times lower. In addition, with such small measurement quantities, a decisive part is increasingly played by the unavoidable noise effects of the electronic components or circuits used, which leads to an additional deterioration of the measurement precision and resolution of a method or circuit arrangement for measuring such quantities.

With time or time-resolved measuring methods, which are used for avoiding the influences of different curve shapes of the measurement signals of a threshold switch, e.g. a Schmitt trigger, due to the time lag of the threshold switch a further problem arises, because such a lag cannot generally be ignored. It is particularly noticeable with strain gauges in the measured result with values of up to 10 ppm. As it is also highly dependent on the temperature and voltage, the threshold switch time lag is also noticeable as a temperature error.

Known electrical resistance measurement methods, such as are e.g. known from DE 44 20 998 C2, use signal processing means in the form of processors or rapid counters for determining time intervals.

In the processor sector at present using conventional processes maximum clock frequencies of approximately 20 MHz can be implemented. When using hardware-based, rapid counters this can be raised to approximately 200 MHz. Beyond this value significantly increased costs and high current consumption or power loss make such a device uncompetitive and can only therefore be used to a limited extent as a result of its restricted time resolution.

The problem of the invention is to provide a method and a circuit for the precise measurement of resistances, whilst avoiding the aforementioned disadvantages.

SUMMARY OF THE INVENTION

In the case of a method of the aforementioned type, the invention solves this problem in that a capacitor is repeatedly charged and discharged and the charging or discharging time is measured by means of at least one resistor and at least one first switch connected in series therewith, at least one second switch connected in series with the resistor and juxtaposed, parallel-connected switches in series with the resistor, whilst using a threshold switch. The invention also solves the set problem in the case of a circuit arrangement for resistance measurement by providing signal processing means, at least one capacitor and with respect thereto mutually parallel-connected, at least two resistors, a first switch being in each case connected in series with the resistors and wherein at least one second switch is connected in parallel with the first switch.

Thus, according to the invention, the same useful resistance is measured in different combination with the replaceable, parasitic switch resistances, so that the interfering part of the latter can be eliminated. According to the invention with the particular resistor, reference and measuring resistors, is not only connected in a single switch, but also a further switch (the switches being connected in parallel to one another). Thus, this permits in the inventive method the performance of discharge measurements not only during the discharge of a resistor across a switch, but also in the case of the discharge across the other switch and during the discharge with simultaneously switched through, two switches and as a result of the measured, different charging times the internal resistances of the switches and therefore the influence thereof on the measured result can be completely eliminated, so that the internal resistances of the switches can play no part when determining the measured result and cannot falsify the latter.

Preferably the time measurement takes place during discharging and not during charging. This makes it possible to perform the charging process with a low current, so that weaker current sources can be used.

An important advantage of the invention is that no expensive and complicated, external transistors have to be used, but instead use can be made of transistors available in processors and other integrated circuits, such as FPGAs or ASICs, so that the overall circuit can be entirely constructed as an integrated circuit and therefore, as stated, requires no external transistors.

With platinum resistors having a 500 ohm resistance value (PT500) it is sufficient to use standard transistors, i.e. so-called 8 mA types, whilst with 100 ohm platinum resistors at least 24 mA standard transistors should be used, but once again they can be implemented by the parallel connection of several 8 mA transistors.

Unlike in the case of the prior art, interfering effects are not merely minimized, but instead completely eliminated as a result of the circuit and measuring method according to the invention. The determination of the resistance values of reference and measuring resistors to be used, whilst eliminating internal resistances of the switches can be performed rapidly in current-saving manner using processors conventionally available or special arithmetic circuits in integrated circuits (ASICs or FPGAs). The resistance measurement according to the invention can be implemented inexpensively and requires no analog components. It is extremely voltage-stable and temperature-stable. The counters can be constituted by time-to-digital converters or TDCs, whose current consumption is lowerable by more than a power of 10 compared with that of existing solutions.

Whereas in the aforementioned inventive method for determining the resistance, the capacitance of the capacitor must be known, according to a preferred development of the invention the aforementioned measurements and determinations are repeatedly performed over two or more resistances and for determining the resistance ratio of two resistances or resistors, the results are in each case divided by one another.

In order when using the method of the invention with strain gauges to obtain a high accuracy of measurement, according to a further development thereof, the determination of the resistance $Ri$ ($i=1, 2, 3$) takes place by means of a relation, particularly $$C \cdot Ri = ti - \sqrt{ti^2 + ti1 \cdot ti2 - ti1 \cdot ti - ti2 \cdot ti}$$
$$= M + K$$

containing a measurement term (M) and a correction term (K). The correction term represents the time fraction of the internal resistances of the switching transistors. This correction term does not change with the value to be measured, specifically the strain of the strain gauges, but instead only with the change in the internal resistances, i.e. with temperature or voltage fluctuations. As these are only slow changes, it is possible to very highly average the correction term and therefore largely free it from noise effects. Thus, according to a preferred development of the method of the invention, the correction term and the measurement term are averaged with different averaging types and also the correction term is averaged higher by a specific factor, particularly between 32 and 64, than the measurement term.

Thus, the noise of the correction term is reduced almost to zero relative to the measurement term. The lower averaging of the measurement term ensures that also short periodic changes of the measured value, e.g. in the case of oscillation or vibration measurements, are not lost.

In order to eliminate from the measurement results the problematic time lag of the threshold switch (Schmitt trigger), according to the inventive method the measured times are reduced by a time lag of the threshold switch. For this purpose the time lag is determined by measuring the time of in each case a capacitor charge or discharge across a first resistor and a second resistor, as well as a parallel connection of both resistors by closing a first switch, a second switch or both switches.

The time lag of the Schmitt trigger can be subdivided into two. One time interval is dependent on the fundamental parameters of the Schmitt trigger, as well as temperature and voltage influences. The second, smaller-amount time fraction is dependent on the steepness of the input slope of the signal at the Schmitt trigger. In the present case it is an e-function resulting from the charge/discharge characteristic of the capacitor. The first and dominant of the two time fractions can be compensated by the inventive method, so that the measuring errors caused by the threshold switch lag can be significantly reduced.

According to a highly preferred further development of the inventive method, there is a separate determination of the charging/discharging times for resistance measurement and the time lag. Preferably a time-to-digital converter (TDC) is used for time measurement purposes. When using a timing unit in the form of a TDC, compared with the conventionally used processors or hardware counters, it is possible to achieve much higher clock frequencies of >50 GHz. The method according to the invention operates roughly 250 times faster than the rapid counter variants and is also characterized by a much lower current consumption. Within the framework of the uses where when using a TDC a measured value resolution of 11 bits, i.e. a more than 2,000 times subdivision of the measuring range at a measuring frequency of 100 Hz can be implemented, counter variants only give a measured value every 2.5 seconds and are consequently not competitive. To avoid such disadvantages in known methods, it was necessary to use capacitors with a 250× capacitance. Such capacitors were in the range of a few μF, but were unable to fulfil the high linearity demands made for such applications. Such demands are only satisfied by capacitors with special dielectrics (e.g. plastics) unable to effectively implement such high capacitances.

According to a further development of the inventive circuit, at least one of the resistances is a known reference resistance and at least one is an unknown measuring resistance.

A preferred field of use of the invention is the measurement of mechanical quantities using strain gauges, which as a result of strain change their resistance. With strain gauges the particular application significantly decides on how many resistances are measured. Frequently a complete bridge of four resistors or resistances is measured, because only through the mechanical arrangement of the strain gauge resistors on the object to be measured (e.g. a weighing scale pan) is the necessary precision and linearity obtained. In the case of e.g. a complete bridge, all the resistors are measuring resistors and only the mutual ratio thereof gives the measured value.

Another field of use is the heat consumption determination of a heat consuming means. With the temperature measurement necessary here, typically one of the resistors, e.g. R1, is a known reference resistor, whilst by means of the further measuring resistors measurement takes place of the temperature in the forward and also temperature-dependent return movement of a heating means and from the difference of these two temperatures, represented by the resistance values of the measuring resistors, the heat quantity consumed is calculated.

DESCRIPTION OF THE DRAWING

Further advantages and features of the invention can be gathered from the claims and the following description of an embodiment of the invention with reference to the single attached drawing of a preferred development of the circuit according to the invention.

DETAILED DESCRIPTION OF THE EMBODIMENT

The circuit according to the invention has a current or power source 1 in the form of a tri-state buffer by means of which it is possible to charge a capacitor C. In the embodiment shown with the capacitor are connected in parallel and parallel to one another three resistors R1, R2 and R3, with which are connected in series and parallel to one another in each case two switches S11 and S12 to R1 or S21 and S22 to R2 or S31 and S32 to R3.

There is also a threshold switch 3, preferably a Schmitt trigger, which is responsible for the switching of the individual switches on reaching the intended charging or discharging state of the capacitor C. The switches S11, S12, S21, S22, S31, S32 are preferably CMOS transistors, whose internal resistance in the switched on or through state is in a very good approximation an ohmic resistance. The circuit according to the invention also has signal processing means 4, which inter alia incorporate a timing unit 5. The signal processing means 4 also comprise means for the formation of an arithmetic mean from a number of measured values.

The discharge times of the capacitor are measured across the threshold switch by means of a timing unit 5, which can e.g. be formed from TDCs (time-to-digital converters), as are described e.g. in EP 508 232 B1 (not shown in detail here).

A resistance determination method using the above-described circuit takes place in the following way:

With the switches S11, S12, S21, S22, S31, S32 closed, the capacitor C is initially charged by means of the current source 1 to the operating voltage. This is followed by the discharge of capacitor C by closing switch S11, closing switch S12, closing both switches S11 and S12 simultaneously, closing switch S21, closing switch S22 and closing switch S21, closing switches S21 and S22 simultaneously, etc. in each case by means of the resistors R1, R2 or R3 associated with the corresponding switches and in each case until the capacitor voltage drops below the threshold of the threshold switch 3, the discharge times being measured as t11, t12 and t1, t21, t22 and t2 or t31, t32 and t3. If the internal resistance of the switches S11, S12, S21, S22, S31, S32 in the switched on state is designated R11, R12, R21, R22, R31, R32, whilst eliminating the resistances of the switches, the time constant e.g. for the capacitor discharge process across resistor R1 with the discharge times t1, t12, t1 can be determined as follows:

$$(R11 + R1) \cdot C = t11, \qquad (1)$$
$$(R12 + R1) \cdot C = t12,$$
$$\frac{R11 * R12}{(R11 + R12 + R1)} * C = t_1$$

If this equation system 1 is resolved with three unknowns according to R1, in that e.g. the first two equations are in each case resolved according to R11 or R12, inserted in the final equation, which is then resolved according to R, a quadratic equation is obtained in the following form:

$$R1^2 - \frac{2 \cdot t1}{C} R1 + \frac{t1 \cdot t11 + t1 \cdot t12 - t11 \cdot t12}{C^2} \qquad (2)$$

If this equation is resolved with the aid of standard formulae for quadratic equations, we obtain $$C \cdot R1 = t1 - \overline{t1^2 + t11 \cdot t12 - t11 \cdot t1 - t12 \cdot t1} \qquad (3)$$

or for the discharge across resistor R2

$$C \cdot R2 = t2 - \overline{t2^2 + t21 \cdot t22 - t21 \cdot t2 - t22 \cdot t2} \qquad (4)$$

the represented "minus" solution being the correct solution, because of the two solutions the "plus" solution is always incorrect (it gives an excessive resistance).

A division of equations 3 and 4 leads to a solution, which is independent of the amount of the capacitance used, so that a pure resistance ratio of the resistors is obtained.

The same applies for the resistor combinations R2 with R21 and R22, as well as R3 with R31 and R32 or in general with further resistor-switch combinations.

Equations 3 and 4 show the end formulae according to which the numerators and denominators of the resistance ratio are determined. On directly applying these formulae it is possible to determine the ratio of the resistances with a standard deviation of approximately 25 ppm. More precise measurements firstly thwart the noise of the comparator (Schmitt trigger; approx. 12 to 14 ppm) and secondly the additional noise resulting from the correction term (root) of equations 3 and 4.

A measurement of a strain gauge with this precision of 25 ppm gives an effective precision of approximately 80 scale divisions or 6.3 bits ($2^{6.3} \cong 80$). With such a low precision it is virtually impossible to handle applications in the strain gauge sector. Most applications require precisions of 10 to 14 bits or 1024 to 16384 scale divisions.

Thus, what is essential for strain gauge measurement is the multiple measurement according to the invention and the averaging of the results and for this purpose the invention proposes a double averaging method.

Equations 3 and 4 comprise two terms. The root is the correction term, which represents the time fraction from the internal resistances of the switching transistors. As this term only changes slowly, its noise can be largely removed by high averaging over longer time intervals.

The first term incorporates the actual measured value, which cannot be so highly averaged, because otherwise measured value changes to be determined would be lost. In practice it has proved satisfactory to average the correction term approximately 32 to 64 times higher than the measured term. This greatly reduces the noise of the correction term compared with the measured term, so that only the measured term noise is relevant.

With said first averaging the noise of the measured value for a single measurement is reduced to approximately 12 to 14 ppm, i.e. to the comparator noise. Such a value is still not adequate for most applications, so that it is not generally possible to exclude an additional averaging of this value already pre-averaged in one term. If e.g. 11 effective bits, i.e. 2048 parts are required, then a precision of approximately 1 ppm is needed. This is an improvement by a factor of 14 compared with the individual measurement. To achieve this precision averaging over a number of measured values is needed corresponding to the square of the improvement factor (14*14=196). Thus, approximately 200 measurements are performed and the mean or average value is formed and before each of these measurements the above-described averaging of the correction term must be carried out. The mean value now has a standard deviation of approx. 1 ppm eff.

In practice, as a function of the requisite resolution, working takes place with averaging rates between 50 and 10,000.

This makes clear the advantage of the method according to the invention compared with conventional resistance measurement methods and specifically strain gauge measurement. The averaging rate can be chosen at random and can be modified without difficulty during operation. Thus, such a means can be very universally adjusted to the measurement task. Within very wide ranges a choice can be made between a rapid, less precise measurement or a slow and more precise measurement. In laboratory tests resolutions of the measurement ranges of up to approximately 15 bits have been achieved with high averaging rates permitting the implementation of at least 95% of all applications.

In order to largely eliminate the time lag of the threshold switch 3, e.g. a Schmitt trigger, after the charging of the capacitor C the latter is initially discharged across the resistor R1 by closing the switch S11 and by means of the Schmitt trigger 3 and the timing unit 5 the necessary time T1 is measured. This is followed by the discharge of the capacitor C across the resistor R2 by closing switch S21 and time T2 is determined. Then the capacitor C is discharged across the parallel connection of R1 and R2 by closing switches S11 and S12 and the time T3 is measured.

There is no need here for the above-described compensation measurement of the internal resistances. It is also unimportant as to whether one or both switches are discharged. What is decisive is that all three measured times T1, T2, T3 contain the time lag Ts of the Schmitt trigger. The measured times are as follows:

$$T1 = T1meas + TS, \qquad (5)$$

$$T2 = T2meas + TS, \qquad (6)$$

$$T3 = T3meas + TS. \qquad (7)$$

T1meas (i=1, 2, 3) stands for the unfalsified discharge time to be determined.

T3meas can be calculated as a result of the parallel connection of R1 and R2 from T1meas and T2meas:

$$T3meas = (T1meas*T2meas)/(T1meas + T2meas). \qquad (8)$$

Resolution of equations 5 and 6 according to T1meas or T2meas and use in equation 8 gives a new equation, which can be inserted in equation 7, which leads to a relation between T3 and Ts which, apart from Ts, is only dependent on the measured quantities T1, T2 and T3. Thus, ignoring the quadratic elements in Ts and the use of the relation $$(T1 + T2)/T3 = \frac{(T1 + T2)^2}{T1 \cdot T2} \approx 4 \qquad (9)$$

for similar values of T1 and T2, i.e. similar discharge resistances approximately gives:

$$Ts \cong 2*(T3 - T1*T2)/(T1+T2)) \qquad (10)$$

The error compared with the exact formula derivable from equations 5 to 8 under the normal conditions for strain gauges is below 0.1%.

The time lag Ts is determined in a separate run prior to each measurement. Then all the times required for calculating the resistances according to equation 3 or 4 are reduced by the averaged amount Ts. For the resistance determination according to equation 3 or 4 according to the invention, use is exclusively made of these corrected times.

| REFERENCE NUMERALS LIST | |
|---|---|
| 1 | Current source |
| 3 | Threshold switch |
| 4 | Signal processing means |
| 5 | Timing unit |
| C | Capacitor |
| R1 | Reference resistor |
| R2 | Measuring resistor |
| R3 | Resistor |
| S11, S21 | Switch for R1 |
| S12, S22 | Switch for R2 |
| S31, S32 | Switch for R3. |

What is claimed is:

1. Method for the measurement of resistance, a capacitor being repeatedly charged and discharged, the charging or discharging time across at least one resistor and at least one first switch connected in series therewith, at least one second switch connected in series with the resistor and across juxtaposed, parallel-connected switches connected in series with the resistor, being measured using a threshold switch changing its state, when the capacitor reaches a threshold voltage.

2. Method according to claim 1, wherein the measurements and determinations of claim 1 are performed repeatedly across two or more resistors and for determining the resistance ratio of two resistors the results are in each case divided by one another.

3. Method according to claim 1, wherein for discharging the capacitor in each cases several, parallel-connected, first switches are switched through groupwise.

4. Method according to one claim 1, wherein the determination of a resistance Ri (i=1, 2, 3) takes place by means of a relation, particularly $$C*Ri = t_i - \sqrt{ti^2 + ti1*ti2 - ti1*ti - ti2*ti}$$
$$= M + K$$

containing a measurement term (M) and a correction term (K), where C is the capacitance of the capacitor, and where ti1, ti2, ti (i=1, 2, 3) are the discharging times across the resistance Ri connected in series with the first switch, the second switch, and parallel-connected first and second switches, respectively.

5. Method according to claim 4, wherein the correction term and the measurement term are averaged with different averaging types.

6. Method according to claim 5, wherein the correction term is averaged higher by a specific factor, particularly between 32 and 64 times higher than the measurement term.

7. Method according to claim 1, wherein the measured times are reduced by a time lag of the threshold switch.

8. Method according to claim 7, wherein the time lag is determined by measuring a time of in each case a capacitor charge or a capacitor discharge across a first resistor and a second resistor, as well as a parallel connection of these two resistors by closing a first switch, a second switch or both said switches.

9. Method according to claim 8, wherein the charging/discharging times are separately determined for resistance measurement and time lag.

10. Method according to claim 1, wherein a time-to-digital converter (TDC) is used for time measurement.

11. Circuit arrangement for resistance measurement, particularly according to the method of claim 1, with signal processing means, at least one capacitor and at least two resistors connected in parallel to the latter, a first switch being in each case associated in series with the resistors wherein at least one second switch is connected in parallel to the first switch.

12. Circuit arrangement according to claim 11, wherein at least one of the resistors is a known reference resistor and at least one resistor is an unknown measuring resistor.

13. Circuit arrangement according to claim 11, wherein for the discharge of the capacitor in each case, several, parallel-connected, first switches can be switched through groupwise.

14. Circuit arrangement according to claim 11, wherein there are simultaneously switchable groups of parallel-connected, first and second switches.

15. Circuit arrangement according to claim 11, wherein the signal processing means incorporate an electronic timing unit.

16. Circuit arrangement according to claim 15, wherein the timing unit is constructed as a time-to-digital converter.

17. Circuit arrangement according to claim 11, wherein the signal processing means are constructed for averaging measured values with a plurality of different averaging rates.

* * * * *